(12) United States Patent (10) Patent No.: US 9,128,129 B2
Rodehorst (45) Date of Patent: Sep. 8, 2015

(54) WATCHDOG FOR VOLTAGE DETECTOR DISPLAY

(75) Inventor: Lutz Rodehorst, Bad Krozingen (DE)

(73) Assignee: Fluke Corporation, Everett, WA (US)

( * ) Notice: Subject to any disclaimer, the term of this patent is extended or adjusted under 35 U.S.C. 154(b) by 24 days.

(21) Appl. No.: 13/604,445

(22) Filed: Sep. 5, 2012

(65) Prior Publication Data

US 2013/0057409 A1 Mar. 7, 2013

(30) Foreign Application Priority Data

Sep. 5, 2011 (EP) .................................. 11007172

(51) Int. Cl.
*G08B 21/00* (2006.01)
*G01R 19/25* (2006.01)
*G01R 35/00* (2006.01)

(52) U.S. Cl.
CPC ............ *G01R 19/2503* (2013.01); *G01R 35/00* (2013.01)

(58) Field of Classification Search
USPC .............. 340/659, 661, 662, 663, 660, 654, 340/636.15; 714/22, 23, 30, 51, 55
See application file for complete search history.

(56) References Cited

U.S. PATENT DOCUMENTS

| | | | | |
|---|---|---|---|---|
| 4,238,696 A | * | 12/1980 | Smart | 327/74 |
| 4,333,049 A | * | 6/1982 | Yui et al. | 324/102 |
| 4,586,179 A | * | 4/1986 | Sirazi et al. | 714/22 |
| 4,777,633 A | * | 10/1988 | Fletcher et al. | 370/345 |
| 4,809,280 A | * | 2/1989 | Shonaka | 714/55 |
| 4,855,913 A | * | 8/1989 | Brekkestran et al. | 701/66 |
| 4,879,647 A | * | 11/1989 | Yazawa | 714/55 |
| 4,967,385 A | * | 10/1990 | Brekkestran et al. | 702/105 |
| 5,043,892 A | * | 8/1991 | Brekkestran et al. | 701/51 |
| 5,053,960 A | * | 10/1991 | Brekkestran et al. | 701/51 |
| 5,081,625 A | * | 1/1992 | Rhee et al. | 714/55 |
| 5,192,914 A | * | 3/1993 | Sudo et al. | 327/34 |
| 5,199,007 A | * | 3/1993 | Okano | 368/108 |
| 5,233,525 A | * | 8/1993 | Overmann et al. | 701/55 |
| 5,247,163 A | * | 9/1993 | Ohno et al. | 235/492 |
| 5,398,332 A | * | 3/1995 | Komoda et al. | 714/55 |
| 5,426,776 A | * | 6/1995 | Erdman | 714/55 |
| 5,440,603 A | * | 8/1995 | Sugita | 377/20 |
| 5,440,725 A | * | 8/1995 | Weller et al. | 714/55 |
| 5,450,321 A | * | 9/1995 | Crane | 701/31.6 |

(Continued)

FOREIGN PATENT DOCUMENTS

DE 102008008047 A1 * 8/2009 ............. H02H 3/04
JP 63213984 A * 9/1988 ............. H01S 3/134

(Continued)

OTHER PUBLICATIONS

European Office Action dated Nov. 6, 2013, in European Application No. 11 007 172.7, filed Sep. 5, 2011, 6 pages.

(Continued)

*Primary Examiner* — Paul Obiniyi
(74) *Attorney, Agent, or Firm* — Seed IP Law Group PLLC

(57) ABSTRACT

The present invention relates to a watchdog timer dedicated to the display controller of a voltage detector wherein the watchdog determines a malfunction in the microcontroller and triggers a visual warning to be displayed via the display controller. This prevents inaccurate voltage information from being displayed in the case of a microcontroller malfunction and thereby the user from being exposed to the risk of extreme injury through, for example, a high-voltage shock.

15 Claims, 3 Drawing Sheets

(56) References Cited

U.S. PATENT DOCUMENTS

| | | | |
|---|---|---|---|
| 5,500,584 A * | 3/1996 | Shimomoto | 320/159 |
| 5,522,040 A * | 5/1996 | Hofsass et al. | 714/55 |
| 5,537,024 A * | 7/1996 | Lang | 340/636.15 |
| 5,711,391 A * | 1/1998 | Brandt et al. | 180/273 |
| 6,208,242 B1 * | 3/2001 | Engelmann et al. | 340/438 |
| 6,292,717 B1 * | 9/2001 | Alexander et al. | 700/293 |
| 6,295,002 B1 * | 9/2001 | Fukuda | 340/636.1 |
| 6,734,856 B2 * | 5/2004 | Ishikawa et al. | 345/440 |
| 6,788,214 B2 * | 9/2004 | Lelecas | 340/654 |
| 6,961,866 B2 * | 11/2005 | Janin et al. | 714/3 |
| 7,863,858 B2 * | 1/2011 | Gangstoe et al. | 320/106 |
| 8,264,294 B2 * | 9/2012 | Oishi et al. | 331/176 |
| 8,340,163 B2 * | 12/2012 | Gilliland | 375/220 |
| 2004/0059250 A1 * | 3/2004 | Causevic et al. | 600/559 |
| 2005/0015160 A1 * | 1/2005 | Hashimoto et al. | 700/20 |
| 2005/0034015 A1 * | 2/2005 | Hashimoto et al. | 714/18 |
| 2005/0080529 A1 * | 4/2005 | Hashimoto et al. | 701/36 |
| 2005/0114732 A1 * | 5/2005 | Janin et al. | 714/30 |
| 2006/0036380 A1 * | 2/2006 | Lee et al. | 702/60 |
| 2006/0129883 A1 * | 6/2006 | Nakamura et al. | 714/14 |
| 2006/0290691 A1 * | 12/2006 | Sato et al. | 345/211 |
| 2007/0174743 A1 * | 7/2007 | Kuroki | 714/57 |
| 2009/0243539 A1 * | 10/2009 | Gangstoe et al. | 320/106 |
| 2012/0116700 A1 * | 5/2012 | Liu | 702/63 |
| 2012/0299663 A1 * | 11/2012 | Oishi et al. | 331/1 A |

FOREIGN PATENT DOCUMENTS

| | | | | |
|---|---|---|---|---|
| JP | 05257750 A | * | 10/1993 | G06F 11/30 |
| JP | 08171519 A | * | 7/1996 | G06F 13/00 |
| JP | 2011008494 A | * | 1/2011 | |
| JP | 2011008496 A | * | 1/2011 | |

OTHER PUBLICATIONS

European Patent Application No. 11007172.7, Extended European Search Report, 7 pages, Feb. 21, 2012.

* cited by examiner

WATCHDOG FOR VOLTAGE DETECTOR DISPLAY

CROSS-REFERENCE TO RELATED APPLICATION

This patent application claims the benefit under 35 U.S.C. §119 to European Patent Application No. 11007172.7, filed Sep. 5, 2011, for "Watchdog For Voltage Detector Display," which is incorporated herein in its entirety by reference.

TECHNICAL FIELD

The present invention relates to a fault warning system, in particular to alert a user of a malfunction of the microcontroller via a voltage detector display.

BACKGROUND

Voltage detectors commonly used to detect the presence of high voltages use microcontrollers to automatically control parts of the devices such as the voltage input and the display. The display of a voltage detector may be intermittently refreshed in order to provide a visual indication of input voltages detected by the detector in real time. The microcontroller may be used to control the refreshing of the display and hence the accuracy of the voltage values displayed.

Microcontrollers may also contain a watchdog timer that triggers a system reset or other corrective action if the microcontroller, due to some fault condition, neglects to regularly service the watchdog. The intention is to bring the system back from the unresponsive state into normal operation. The most common use of watchdog timers is in embedded systems, where the watchdog timer is often a built-in unit of a microcontroller. A watchdog timer may also be external to the microcontroller. Watchdog timers may also trigger fail-safe control systems to move into a safety state, such as turning off high-voltage electrical outputs, and other potentially dangerous subsystems until the fault is cleared.

A disadvantage of such a voltage detector is that if the microcontroller malfunctions, the value of voltage displayed may not accurately represent the actual detected voltage. For example, the voltage detected may be much higher than the value displayed thereby exposing the user to extreme risk of injury.

SUMMARY OF INVENTION

The present invention solves this problem by virtue of the features of the independent claims. Preferred advantageous embodiments thereof are represented by the features of the dependent claims.

The present invention provides a voltage detector comprising a watchdog timer dedicated to the display which monitors the microcontroller operation and, if a malfunction is detected, triggers a visual warning mechanism via the display to warn the user that there is a malfunction and the value indicated by the display may not be accurate and that a risk of injury may thus exist.

If a malfunction is determined by the watchdog timer it may, for example, trigger a warning mechanism which causes the display to cease displaying the detected voltage values and instead indicate a hazardous high voltage value, in order to alert the user that they may potentially be at risk, even if no such hazardous voltage is present. This ensures the safety of the user in any case, regardless of whether the microcontroller malfunction is of a minor nature or more serious.

In a preferred embodiment, the watchdog timer is arranged independent of the microcontroller i.e. external thereto rather than integral. This is advantageous as it is not subject to the same clock signals of the microcontroller and thus provides an additional independent malfunction detection means, for example, in addition to other watchdog circuits which are dedicated to monitoring other parts or functions of the microcontroller.

In another embodiment, the watchdog is configured to trigger the visual warning by triggering an asynchronous reset of the controller of the display. This beneficially simplifies the system operation by, for example, effectively causing the display to generate the warning message as soon as a microcontroller malfunction is detected, thereby advantageously avoiding having to restart the microcontroller, which would in any case not necessarily remedy the malfunction.

In a further embodiment, the asynchronous reset of the display controller is triggered if a specific sequence of signals from the microprocessor are not received within a predetermined time period. This provides the voltage detector with a security mechanism to distinguish between normal operation of the microcontroller and a malfunction i.e. wherein the watchdog is not refreshed by the microcontroller.

In another embodiment, the display controller comprises a clock configured to suppress detected voltage data signals from the microprocessor received by the display controller after a predetermined time period. This provides a high level of safety by ensuring that, once a malfunction of the microcontroller has been determined, the visual warning is triggered and the user is immediately alerted and continually made aware of the potential risk, even if the microcontroller returns to seemingly functioning normally i.e. by sending further signals which are in the specified sequence and the predetermined time limit.

In a preferred embodiment, the display comprises a plurality of LEDs to indicate the respective voltage values detected. Each LED may represent a particular input voltage detected wherein either the individual LED lights up to display the detected voltage, or all LEDs up to and including the detected voltage light up. The highest voltage may involve all of the LEDs being lit up at the same time. The display may also comprise further LEDs related to various other functions of the voltage detector such as type of voltage i.e. AC or DC, voltage phase and/or polarity, and battery power. The visual warning may therefore similarly comprise operation of all of the LEDs simultaneously. By operating all LEDs corresponding to the highest voltage or in addition to other additional LEDs, the detector thereby ensures that there is a clear visual warning to the user and no ambiguity remains with regard to the possible risk a user may be subject to due to the microprocessor malfunction. It will be understood by the skilled person that other means of providing a warning are possible such as an audio or mechanical alert.

DETAILED DESCRIPTION

Figure 1:
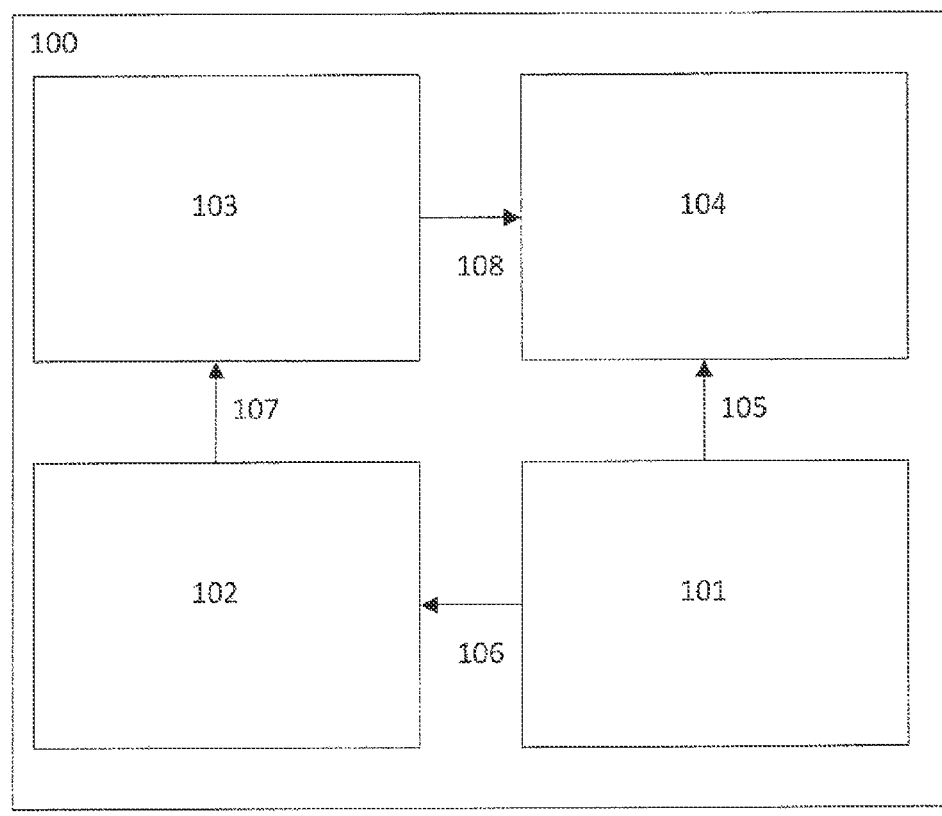
FIG. 1 is a block diagram of an exemplary implementation of the present invention.

FIG. 1 is a block diagram showing a voltage detector 100 comprising a microcontroller 101 which controls the writing of data, comprising voltage values detected by the detector, to a display 104 via a data link 105. A watchdog timer 102 is configured to monitor the function of the microcontroller to check whether a reset pulse has been generated by the microprocessor via data link 106. The periodic generation of such a pulse by the microprocessor indicates the correct function of the microprocessor. The watchdog timer is preferably arranged externally to the microcontroller so that it is not subject to the same clock signals as the microprocessor. The watchdog timer is in turn connected to a display controller 103 via data link 107. An example of such a display controller is an 8-bit parallel-out serial shift register such as the SN74HC164 manufactured by Texas Instruments. The display controller acts as a driver to control the display via data link 108 by means of a plurality of outputs which are operated dependent on the input to the display controller. The watchdog timer effectively acts as an interface between the LED controller and the microprocessor.

Figure 2:
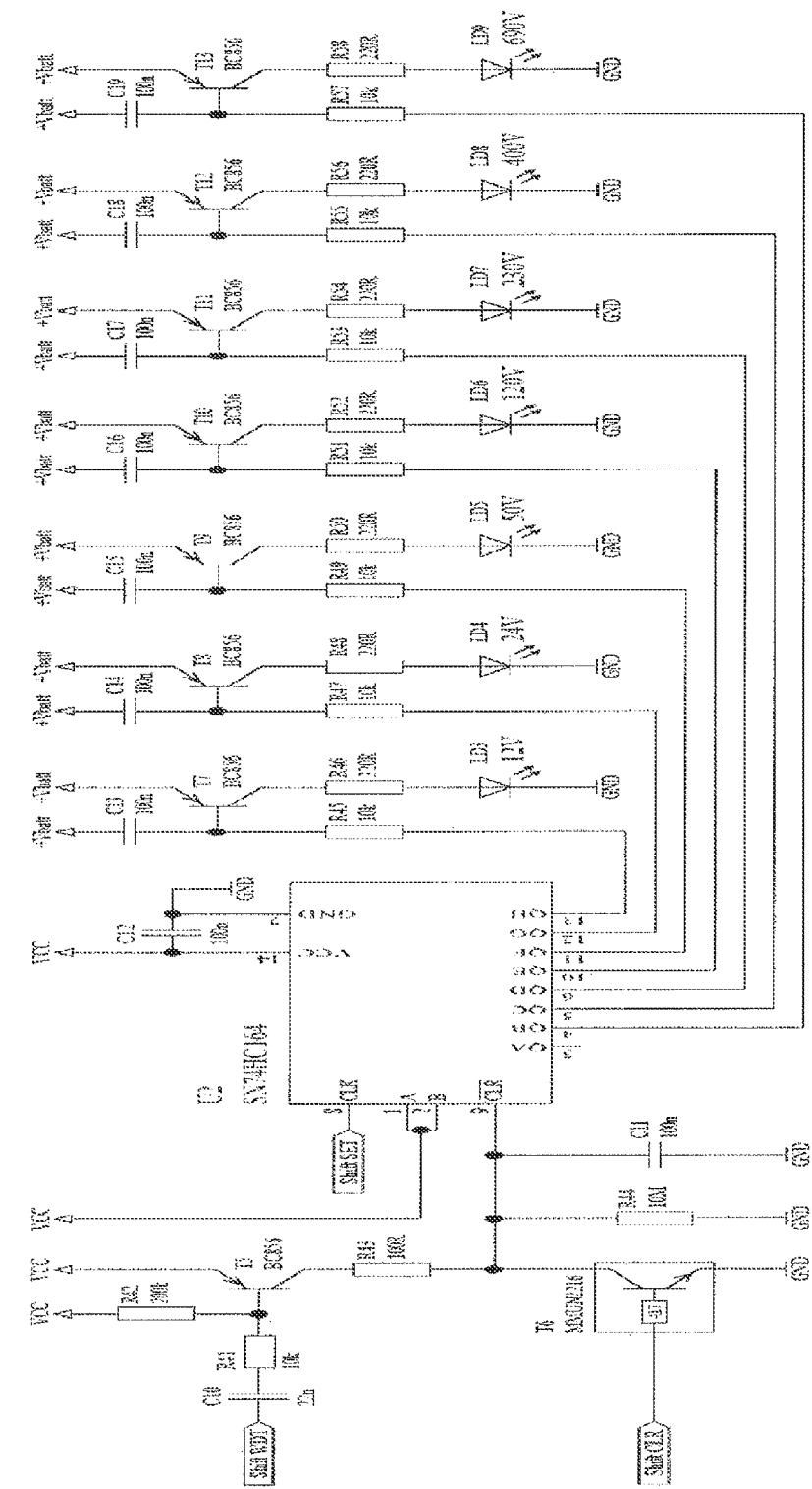
FIG. 2 is a circuit diagram of an exemplary implementation of the present invention.

FIG. 2 is a circuit diagram of an exemplary implementation of the present invention. The inputs Shift_CLR and Shift_WDT are determined by the microcontroller and are responsible for changing the display controller CLR between Low (L-Level) and High (H-Level) according to the polarity of their input signals.

According to a preferred embodiment of the present invention, a sequence of signals sent by the microcontroller to the Shift_CLR and Shift_WDT inputs prepare the display controller for having detected voltage data written to it. Thereafter the microprocessor sends the detected voltage data to the display controller via a Shift_SET input. This information to be displayed has to be set within 200 S. Otherwise voltage LED with no data shifted in will turn on.

The outputs of the display controller in turn control the operation of a plurality of LEDs which may each represent a voltage value, for example 12V, 24V, 50V, 120V, 230V, 400V and 690V. When a voltage is measured by the voltage detector, the microprocessor sends a signal to the display controller via the Shift_CLR input to indicate whether the information being currently displayed should be maintained or altered. The display controller controls the operation of a single LED or number of LEDs corresponding to the detected voltage in order to display the detected voltage to the user. Whilst detecting the voltage, the microcontroller periodically refreshes the LED display in order to ensure the voltage values displayed are current.

Figure 3:
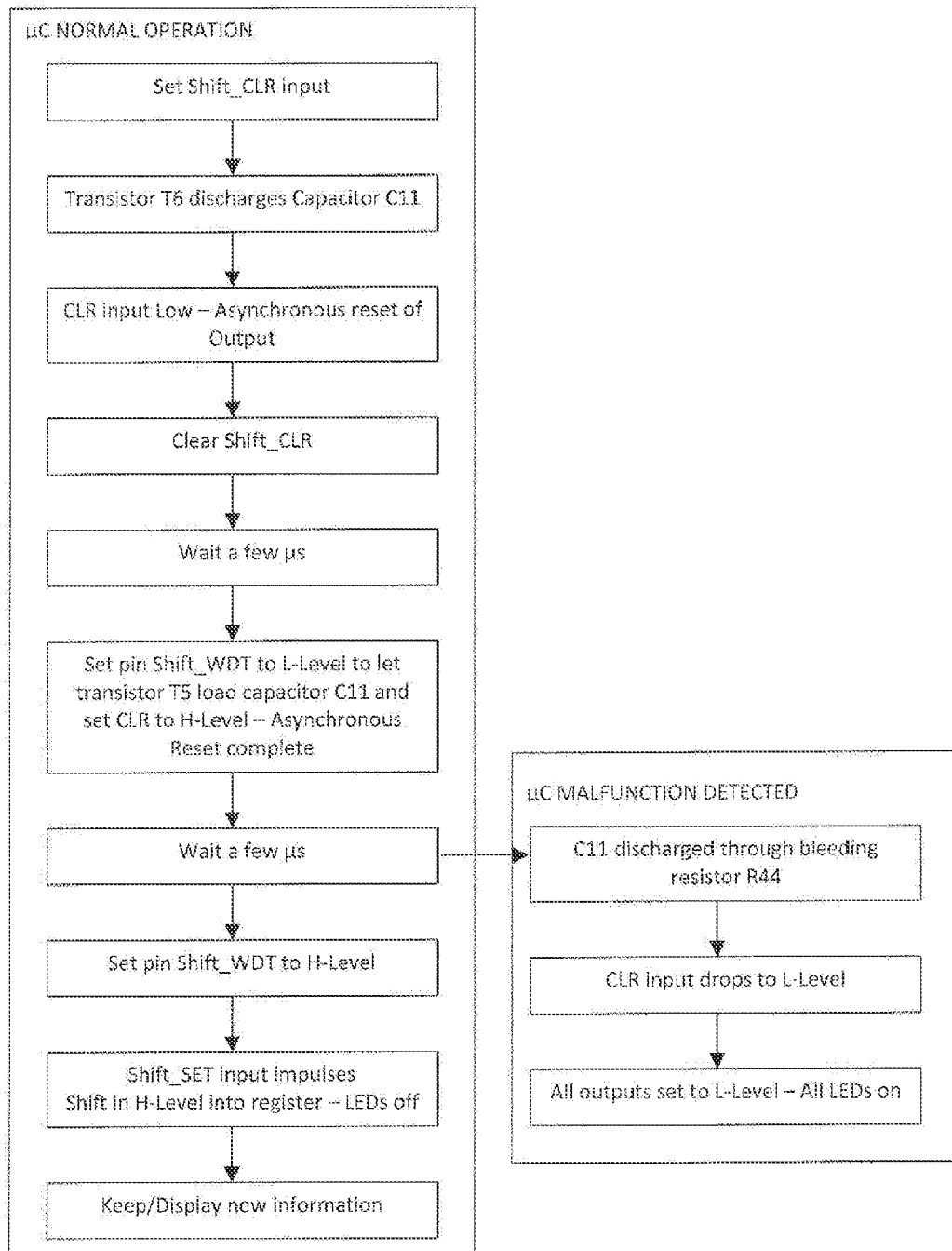
FIG. 3 is a flow diagram illustrating exemplary operational steps of the circuit of figure FIG. 2 according to the present invention.

FIG. 3 is a flow diagram indicating a number of different operational steps which are performed by the circuit of FIG. 2 in an exemplary implementation of the invention. In particular, FIG. 3 illustrates the operational steps undertaken to prepare the display controller for having detected voltage data written to it during normal operation of the microprocessor in addition to the alternative steps implemented should a malfunction of the microcontroller be determined.

In order to write the detected voltage information to the display, the microprocessor initially sets the input Shift_CLR to H-Level. A pause of a few µS then takes place to let Transistor (T6) discharge capacitor C11. T6 functions as an inverter thereby causing an H-Level setting at base of T6 (Shift_CLR) to generate an L-Level setting at the CLR input of the display controller. In response, the display controller then performs an asynchronous reset of its outputs. The input Shift_CLR is then cleared. After a pause a few µS, the watchdog input Shift_WDT is set to H-Level by the microcontroller. This shift to H-Level is input into the display controller and causes the CLR input of the display to be reset to H-Level causing in turn the outputs of the display controller to also be set to H-level wherein the LEDs connected to the outputs are not operational i.e. are off.

In other words, a sequence of operational steps takes place to display the detected voltage information during normal operation of the microcontroller. This sequence comprises the setting of the CLR input of the display controller by the Shift_CLR input, then subsequent resetting of the CLR input by the Shift_WDT. In a preferred embodiment of the invention, a lockout of the CLK via the Shift_SET input of the display controller of approximately 300 µS after the CLR input has been reset from L-level to H-level is implemented. This lockout ensures that there is enough time for the aforementioned sequence of operational steps to be performed. Furthermore, this also ensures that any late shift impulses from the microcontroller i.e. those which were not received within this predetermined period, cannot cause a change in the display due to the timeout. Any late signals indicate a malfunction and are thus suppressed. During normal operation of the microcontroller, received signals ensure that the LEDs which display the detected voltage values are turned off, thus the LEDs will turn on if no signal is received in from the microcontroller within a predetermined time.

In the event that Shift_WDT is not set to L-level and then back to H-level within the predetermined time period, capacitor C11 is discharged through bleeding resistor R44. The CLR input falls to the threshold of L-level (for example, after about 1 S) thereby causing an asynchronous reset to be implemented by the display controller. As previously described, in the event of such a reset, the outputs are all set to L-level thereby causing all of the LEDs of the display (LEDs 3-9) to be turned on at the same time. The display of all LEDs operating simultaneously provides a clear visual warning to the user that there is a malfunction in the microcontroller and that the detected voltage values may not be accurate, thus indicating that the detector is no longer displaying detected voltage information and is now in a safe state for the user. In a preferred embodiment, this visual warning remains and the display continues to operate all LEDs simultaneously even when the user disconnects the voltage detector from the source of the detected voltage.

A clear advantage over known systems is that the last element in the processing chain itself will display the warning message, without the need to restart the microcontroller or perform any further diagnostics. Known systems merely implement a watchdog timer dedicated and generally integral to the microprocessor in order to automatically reset the microcontroller if a malfunction occurs, which requires a complete restart of the microcontroller. The present invention takes into account the fact that, should the malfunction be of a more serious nature, such a reset of the microcontroller would not even remedy the malfunction. This would thereby cause incorrect detected voltage information to be displayed and potentially subjecting the user to a significant risk of injury.

The invention claimed is:

1. A voltage detector that detects voltage, the voltage detector comprising:
   a microcontroller configured to control writing of detected voltage values to a display, wherein the display is configured to display information indicative of detected voltage values;
   a display controller configured to control the display, wherein the microcontroller is external to the display controller; and a watchdog timer that is coupled to an output of the microcontroller and to at least one input of the display controller, wherein the watchdog timer is configured to determine a malfunction of the microcontroller, wherein the watchdog timer is further configured to trigger a visual warning that includes a modification of the information indicative of detected voltage values on the display by causing an asynchronous reset of the display controller, if a malfunction is determined, and wherein the malfunction is determined if a specific sequence of signals from the microcontroller is not received by the watchdog timer within a predetermined time period.

2. The voltage detector of claim 1 wherein the watchdog timer is independent of the microcontroller.

3. The voltage detector of claim 1 wherein the display comprises a plurality of LEDs for indicating the detected voltage values and the visual warning comprises operation of all of the LEDs simultaneously.

4. The voltage detector of claim 1 wherein the asynchronous reset is triggered if the specific sequence of signals from the microcontroller is not received by the watchdog timer within the predetermined time period.

5. The voltage detector of claim 4 wherein the display controller comprises a clock input configured to suppress signals sent from the microcontroller and received by the display controller after the predetermined time period.

6. The voltage detector of claim 5 wherein the display controller further comprises a clear input which may be set to a low level or a high level and wherein the clock input suppresses signals from the microcontroller a wait period after the clear input has been reset from the low level to the high level.

7. A method for a voltage detector comprising a display to display information indicative of detected voltage values comprising:

providing a display controller to control the display;

using a watchdog timer to determine a malfunction of a microcontroller, wherein the microcontroller is external to the display controller, and wherein the watchdog timer is coupled to an output of the microcontroller and to at least one input of the display controller; and triggering a visual warning that includes a modification of the information indicative of the detected voltage values on the display by triggering an asynchronous reset of the display controller by the watchdog timer, if a microcontroller malfunction is determined by the watchdog timer, wherein the microcontroller malfunction is determined by the watchdog timer if a specific sequence of signals from the microcontroller is not received by the watchdog timer within a predetermined time period.

8. The method of claim 7 wherein the watchdog timer is independent of the microcontroller.

9. The method of claim 7 wherein the display comprises a plurality of LEDs for indicating the detected voltage values and operating all of the LEDs simultaneously in order to display the visual warning.

10. The method of claim 7 further comprising using a clock input in the display controller to suppress signals sent from the microcontroller and received by the display controller after a predetermined time period.

11. The method of claim 10 further comprising:

providing a clear input in the display controller and resetting the clear input; and using the clock input to suppress signals from the microcontroller received a wait period after the clear input has been reset.

12. A detector that detects data, the detector comprising:

a processor configured to control writing of information indicative of detected data other than a malfunction status of the processor to a display;

a display controller configured to control the display, wherein the display is configured to display information indicative of data detected by the detector other than a malfunction status of the processor, wherein the processor is external to the display controller;

a watchdog timer coupled to an output of the processor and to at least one input of the display controller, wherein the watchdog timer is configured to determine a malfunction of the processor, wherein the watchdog timer is configured to trigger a visual warning that includes a modification of the information indicative of the detected data on the display, if a malfunction is determined, wherein the watchdog timer is configured to trigger the visual warning by triggering an asynchronous reset of the display controller, and wherein a malfunction is determined if a specific sequence of signals from the processor is not received by the watchdog timer within a predetermined time period.

13. The detector of claim 12 wherein the watchdog timer is independent of the processor.

14. The detector of claim 12 wherein the display comprises a plurality of LEDs for indicating the detected data and the visual warning comprises operation of all of the LEDs simultaneously.

15. The detector of claim 12 wherein the display controller comprises:

a clock input configured to suppress signals sent from the processor and received by the display controller after the predetermined time period; and a clear input which may be set to a low level or a high level and wherein the clock input suppresses signals from the processor a wait period after the clear input has been reset from the low level to the high level.

* * * * *